(12) United States Patent
Higashi et al.

(10) Patent No.: US 7,219,419 B2
(45) Date of Patent: May 22, 2007

(54) COMPONENT MOUNTING APPARATUS INCLUDING A POLISHING DEVICE

(75) Inventors: Kazushi Higashi, Neyagawa (JP); Shozo Minamitani, Ibaraki (JP); Shinji Kanayama, Kashihara (JP); Kenji Takahashi, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 10/375,953

(22) Filed: Feb. 28, 2003

(65) Prior Publication Data

US 2003/0150108 A1   Aug. 14, 2003

Related U.S. Application Data

(62) Division of application No. 09/388,705, filed on Sep. 2, 1999, now abandoned.

(30) Foreign Application Priority Data

Sep. 9, 1998   (JP) ................... 10-254963

(51) Int. Cl.
  *B23P 19/00* (2006.01)
(52) U.S. Cl. .................. 29/740; 29/739; 29/832; 29/839; 29/840; 451/5; 451/35; 451/163; 451/164; 451/165; 451/143; 228/1.1; 228/205; 228/110.1; 228/8; 228/102; 156/580.1; 156/580.2
(58) Field of Classification Search .................. 29/832, 29/839, 840, 739, 740; 451/5, 35, 163, 164, 451/165, 143; 228/1.1, 205, 110.1, 8, 102; 156/731, 732, 580.1, 580.2
See application file for complete search history.

(56) References Cited

U.S. PATENT DOCUMENTS

| | | | |
|---|---|---|---|
| 3,479,716 A | 11/1969 | Zanger, Jr. et al. | |
| 3,531,852 A | 10/1970 | Slemmons et al. | |
| 3,542,277 A | 11/1970 | Andrews et al. | |
| 3,672,037 A | 6/1972 | Kindlimann et al. | |
| 3,750,926 A | 8/1973 | Sakamoto et al. | |
| 4,005,906 A | 2/1977 | McKenry et al. | |
| 4,049,506 A | 9/1977 | Gilding | |
| 4,227,842 A | 10/1980 | Samanta et al. | |
| 4,242,837 A * | 1/1981 | Lohse | 451/164 |
| 4,297,387 A | 10/1981 | Beale | |
| 4,300,952 A | 11/1981 | Ingelstroem et al. | |
| 4,374,900 A | 2/1983 | Hara et al. | |
| 4,436,830 A | 3/1984 | Andreev et al. | |
| 4,656,787 A * | 4/1987 | Ueda et al. | 451/143 |
| 4,703,884 A | 11/1987 | Landingham et al. | |
| 4,890,782 A | 1/1990 | Nakai et al. | |
| 5,029,383 A | 7/1991 | Snyder et al. | |
| 5,033,783 A | 7/1991 | Izumi et al. | |

(Continued)

*Primary Examiner*—Richard Chang

(57) ABSTRACT

Component (3) is pressed onto a circuit board (4) so that their respective metal interconnects (5), (6) are in close contact with each other, and ultrasonic vibration is applied to the suction nozzle (14) holding the component (3). Friction is thereby generated between metal interconnects (5), (6) whereby the component (3) is bonded on circuit substrate. Suction nozzle (14) for handling components is made of stainless steel and has a working face (14a) provided with a hardened layer (14b), or alternatively, suction nozzle (14) may have a suction head (14c) having a working face (14a) made of cemented carbide. Working face (14a) of suction nozzle (14) is refined by polishing as required during the mounting operation.

22 Claims, 10 Drawing Sheets

U.S. PATENT DOCUMENTS

| | | |
|---|---|---|
| 5,037,491 A | 8/1991 | Fox |
| 5,083,401 A * | 1/1992 | Yamashita et al. ............. 451/5 |
| 5,147,082 A | 9/1992 | Krause et al. |
| 5,277,356 A | 1/1994 | Kawauchi |
| 5,341,979 A * | 8/1994 | Gupta ........................ 228/111 |
| 5,423,558 A | 6/1995 | Koeth et al. |
| 5,435,482 A | 7/1995 | Variot et al. |
| 5,603,444 A | 2/1997 | Sato |
| 5,651,494 A | 7/1997 | Ogino et al. |
| 5,669,545 A * | 9/1997 | Pham et al. ................. 228/1.1 |
| 5,722,803 A | 3/1998 | Battaglia et al. |
| 5,745,986 A | 5/1998 | Variot et al. |
| 5,758,410 A | 6/1998 | Asai et al. |
| 5,780,139 A | 7/1998 | Carter et al. |
| 5,816,472 A | 10/1998 | Linn |
| 5,854,745 A * | 12/1998 | Muraoka et al. .............. 700/58 |
| 5,866,271 A | 2/1999 | Stueber et al. |
| 5,874,153 A | 2/1999 | Bode et al. |
| 5,955,203 A | 9/1999 | Briggs et al. |
| 5,989,937 A | 11/1999 | Variot et al. |
| 5,993,300 A | 11/1999 | Hashimoto |
| 6,001,180 A | 12/1999 | Inoue |
| 6,010,391 A * | 1/2000 | Lewellen et al. ............. 451/35 |
| 6,045,026 A * | 4/2000 | Hembree et al. ........ 228/110.1 |
| 6,158,645 A | 12/2000 | Sakamoto et al. |

* cited by examiner

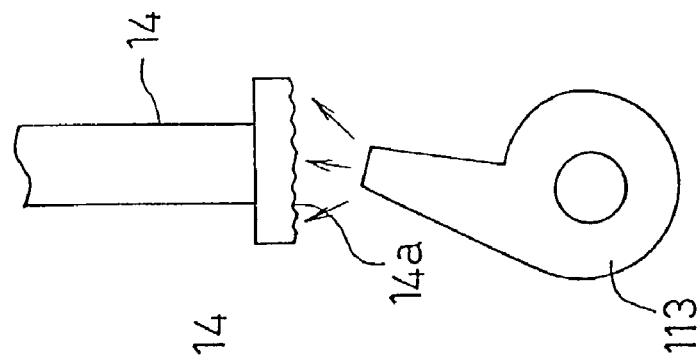
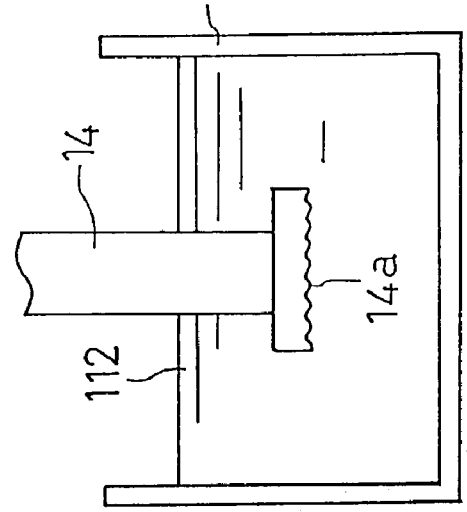
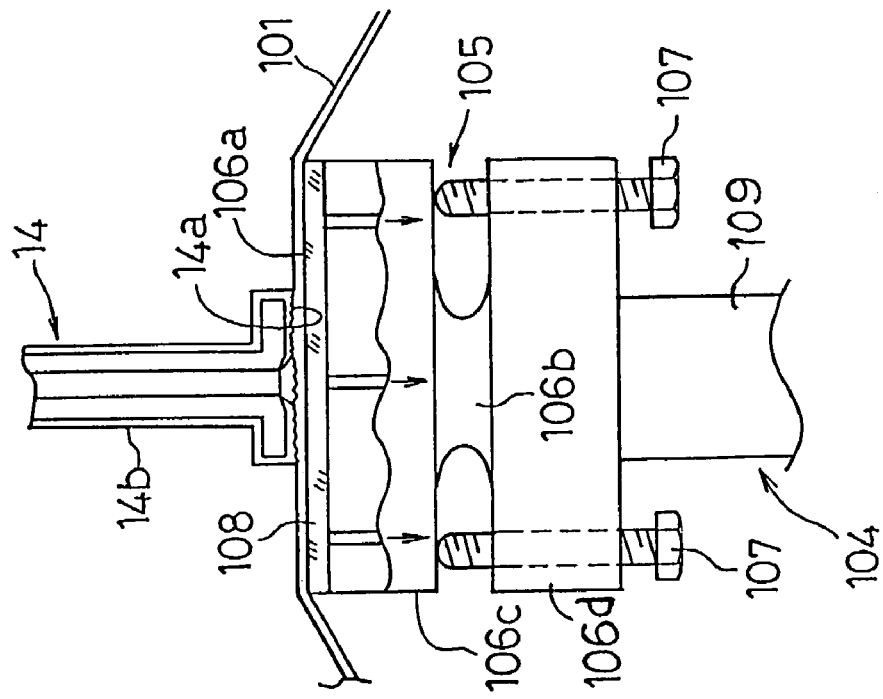

COMPONENT MOUNTING APPARATUS INCLUDING A POLISHING DEVICE

This is a divisional application of U.S. application Ser. No. 09/388,705 filed on Sep. 2, 1999 now abandoned.

BACKGROUND OF THE INVENTION

1. Technical Field of the Invention

The present invention relates to a component mounting tool, and component mounting method and apparatus using this component mounting tool, wherein a component is mounted on an object by friction-bonding their respective metallic interconnects. In particular, it describes the process of manufacturing an electronic circuit substrate wherein an electronic component such as bare IC chip is mounted onto a printed wiring circuit board in electrical connection therewith by ultrasonic bonding.

2. Description of Prior Art

Bare IC chips are formed of a semiconductor wafer on which circuit patterns are fabricated using thin-film forming techniques and mounted on a printed board thereby manufacturing an electronic circuit board. For electrically connecting electrodes prefabricated with circuit pattern on bare IC chips with conductive lands formed on printed wiring boards, a so-called surface mount method is used wherein the bonding face of an unpackaged IC chip and the bonding face of a board are faced to each other and fixedly mounted so that electrical connection between electrode of chip and conductive land of board is achieved.

The applicants of the present invention have proposed a method of mounting a bare IC chip on a circuit board by ultrasonic-bonding a bump on the chip and a conductive land on the circuit board. More specifically, the bare IC chip, on which a metal bump has been preliminarily formed by a wire bonding process or the like, is held by suction with a suction nozzle and is brought opposite to the circuit board at a predetermined location, where the bump contacts the conductive land. The suction nozzle is rockably supported and ultrasonic vibration is applied to between the support point of the nozzle and working face of nozzle to vibrate the IC chip thereby generating friction between bump and land.

The requirements of secure electrical connection and high mounting strength are satisfied by the above bonding method which involves metal welding. Moreover, chips can be swiftly installed on circuit boards. The suction nozzle is advantageously made of stainless steel as it provides good vibration characteristics and thus suitable for bonding metal interconnects of the chip and board by ultrasonic. However, suction nozzles of stainless steel have a relatively short operational life. This is because the flat working face of suction nozzle having a surface roughness of 3~5 μm becomes soon worn off by friction with chips generated by ultrasonic vibration and is decreased in surface regularity and flatness. Also attributable to such abrasive wear are electrochemical reaction between stainless steel and gallium arsenide or silicone of chips, or foreign matter entering between the working face of nozzle and IC chips. Especially in a case where the component to be bonded is an SAW filter, the working face of suction nozzle becomes easily roughened by hard $LiTaO_3$, $LiNbO_3$, or quartz normally used for SAW filter.

A countermeasure for the above problem is the use of stainless steel having high hardness such as SUS420J2 according to Japanese Industrial Standard which is further hardened by quenching. Even so, after repeating bonding operation about 500 times, bonding failure starts to occur, where IC chips crack or fail to be bonded with required shear strength. When an operator judges in the light of such bonding failure that the current suction nozzle is no longer capable of performing favorable ultrasonic bonding, such nozzle is dismounted from the apparatus and refined with abrasives and reused.

Such maintenance operation which is needed frequently is not only troublesome but also badly affects productivity. Moreover, frequent refining of suction nozzles using abrasives result in shorter operational life of nozzle. By way of example, the suction nozzle is decreased in length to a usable limit after thirty times refining, and normally one nozzle is consumed per month.

The use of a material having superior abrasive wear resistance for the suction nozzle would not solve the problem either, since the vibration characteristics would be deteriorated and ultrasonic bonding itself could not be performed favorably.

SUMMARY OF THE INVENTION

An object of the present invention is to provide a suction nozzle which exhibits good vibration characteristics and of which working face has improved abrasive wear resistance, and a method and apparatus of mounting components using this suction nozzle, in which a component is mounted on an object by ultrasonic-bonding their respective metal interconnects, and when necessary, the working face of suction nozzle is refined quickly using the ultrasonic vibration for the ultrasonic bonding so that mounting operation can be continued without long interruptions.

To accomplish the above object, the component mounting tool or the suction nozzle of the present invention is made of stainless steel and has a hardened layer on its working face. Alternatively, the component mounting tool or the suction nozzle may include a suction head made of ceramic carbide. In both cases the working face is formed to have a predetermined surface roughness.

This suction nozzle is used in a component mounting method wherein metal interconnects of a component and an object are bonded by friction by applying ultrasonic vibration to a point between the support point of rockable suction nozzle and its working face. The hardened layer or the suction head made of cemented carbide hardly affects the vibration characteristics and vibration transmission characteristics of the suction nozzle, since the suction nozzle is mainly made of stainless steel and its working face is formed to have a predetermined roughness. The above ultrasonic bonding can thus be achieved swiftly and precisely. Deterioration of surface regularity and flatness because of abrasion caused by repeated ultrasonic bonding, electrochemical reaction, or foreign matter is suppressed because of the hardened layer or cemented carbide applied to the working face. The suction nozzle can thus exhibit favorable bonding characteristics stably for a longer period of time and the frequent replacement thereof becomes no longer necessary. The operational life of suction nozzle is thus lengthened. As the downtime of the component mounting apparatus for ultrasonic bonding operation is reduced, productivity is enhanced accordingly.

The hardened layer may be provided by various processes such as coating or refining.

While the above described ultrasonic bonding using suction nozzle is repeated, an abrasive is brought into contact with the working face and ultrasonic vibration is applied to the suction nozzle at appropriate time so that the working face is rubbed with abrasive and thereby refined to have a predetermined roughness. In this way, polishing of the working face can be accomplished efficiently in a short time using friction generated by ultrasonic vibration. Thus the nozzle is refined quickly without replacement thereof during the component mounting operation.

The abrasive is in a continuous form and fed such that the working face is refined with fresh abrasive repeatedly without exchange operation of abrasive.

The abrasive may be moved as required, for example after completing surface refining treatment once or several times, or intermittently or continuously during the polishing process.

In place of the above surface refining treatment, the working face of suction nozzle may be cleaned by immersing nozzle into cleaning liquid and applying ultrasonic vibration to nozzle. The working face is refined to have desired roughness in a manner wherein foreign substance adhered to the working face during the bonding operation are removed. More preferably, the cleaning may be made after the polishing of working face, by which abrasive powder adhered to the working face that may adversely affect vibration transmission characteristics can be removed. After the cleaning, the working face of suction nozzle may be dried with a blower so as to be swiftly made reusable after cleaning. Blowing is advantageously performed with cold air which does not present problems of heat effect or heat consumption.

The ultrasonic vibration for the purpose of bonding should preferably be applied to the suction nozzle in a direction crossed at right angles to the direction of polishing the working face, i.e., the direction of parallel marks on the working face formed by polishing. The working face can engage the component in a better condition and vibration transmission characteristics are thereby improved. In this regard, the polishing direction should preferably be orthogonal to the vibrating direction for bonding.

The above described component mounting method may be implemented using a component mounting apparatus of the present invention comprising: a component feeding section for feeding components to a predetermined location; an object handling device for handling and positioning an object to which a component is mounted at a predetermined location for component mounting and for transferring the object to other place; a component handling device for picking up a component with a working face of a suction nozzle, bringing the component to a position where a metal interconnect of the component and a metal interconnect of the object face each other, pressing the component onto the object while ultrasonic vibration is applied to the suction nozzle thereby ultrasonic-bonding the component onto the object; a ultrasonic vibration device for applying ultrasonic vibration to between a support point of the suction nozzle around which the suction nozzle is rockably supported and the working face of the suction nozzle; a polishing device for refining the working face of the suction nozzle to have a predetermined surface roughness by frictional contact between the working face and an abrasive; and a controller which performs controlling of the above sections and devices such that while the components are being mounted onto the object by ultrasonic bonding, the polishing device and ultrasonic vibration device are activated at appropriate time for bringing the working face of the suction nozzle into contact with the abrasive and for applying ultrasonic vibration to the suction nozzle so as to rub and refine the working face with the abrasive.

While novel features of the invention are set forth in the preceding, the invention, both as to organization and content, can be further understood and appreciated, along with other objects and features thereof, from the following detailed description and examples when taken in conjunction with the attached drawings.

BRIEF DESCRIPTION OF THE DRAWINGS

FIGS. 4A–4C depict the surface refining treatment of suction nozzle performed during the mounting operation shown in FIG. 3 wherein the working face of suction nozzle is polished, cleaned, and blow-dried;

DESCRIPTION OF PREFERRED EMBODIMENTS

Preferred embodiments of a component mounting suction nozzle and a component mounting method and apparatus of the present invention will be hereinafter described with reference to FIG. 1 through FIG. 10.

Figure 5:
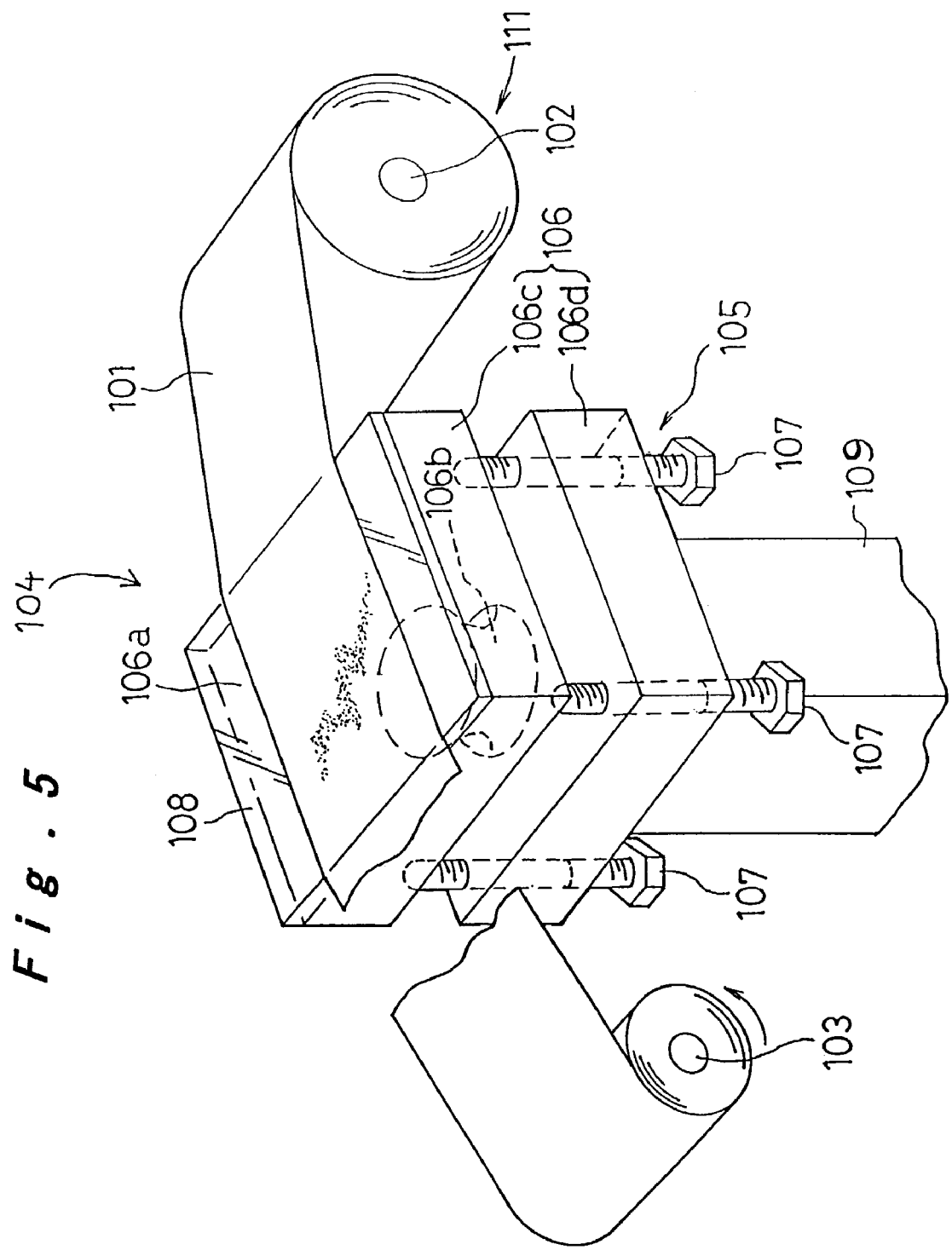
FIG. 5 is a perspective view showing the polishing device for performing refining treatment of suction nozzle.
Figure 10:
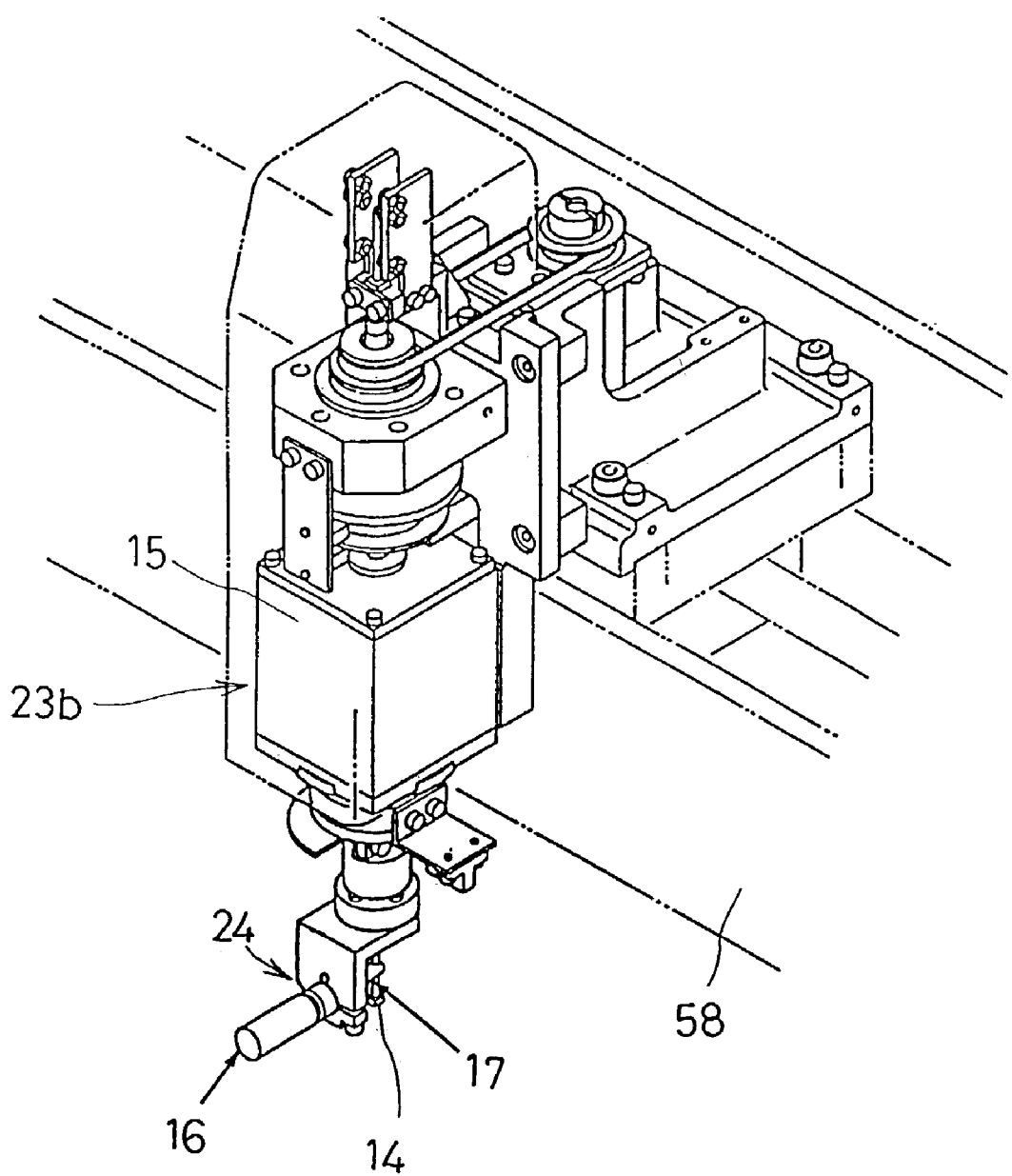
FIG. 10 is a perspective view showing the bonding device of the component handling device in the apparatus shown in FIG. 6.

In this embodiment, bare IC chips 3 diced from a semiconductor wafer 1 on a dicing sheet 2 as shown in FIG. 5 and FIG. 10 are individually handled with a suction nozzle 14 as a component, and a printed wiring circuit board 4 shown in FIG. 1 is handled and referred to as an object. In particular, the embodiment describes a process of ultrasonic bonding for achieving electrical connection between IC chip 3 and circuit board 4 by melting and welding metallic interconnects 5, 6 on both of the chip 3 and board 4. By way of example, the metallic interconnect 5 of IC chip 3 is formed as a metallic bump 8 provided by wire bonding technique on an electrode fabricated by film-forming technique on a semiconductor wafer 1, and the metallic interconnect 6 of circuit board 4 is formed as a conductive land 9 provided on its surface in this embodiment. It should be noted that the present invention can be applied for mounting other electronic components or various other non-electronic components on a circuit board or other various objects including a frame, support, or carrier by ultrasonic bonding their metallic parts.

Figure 6:
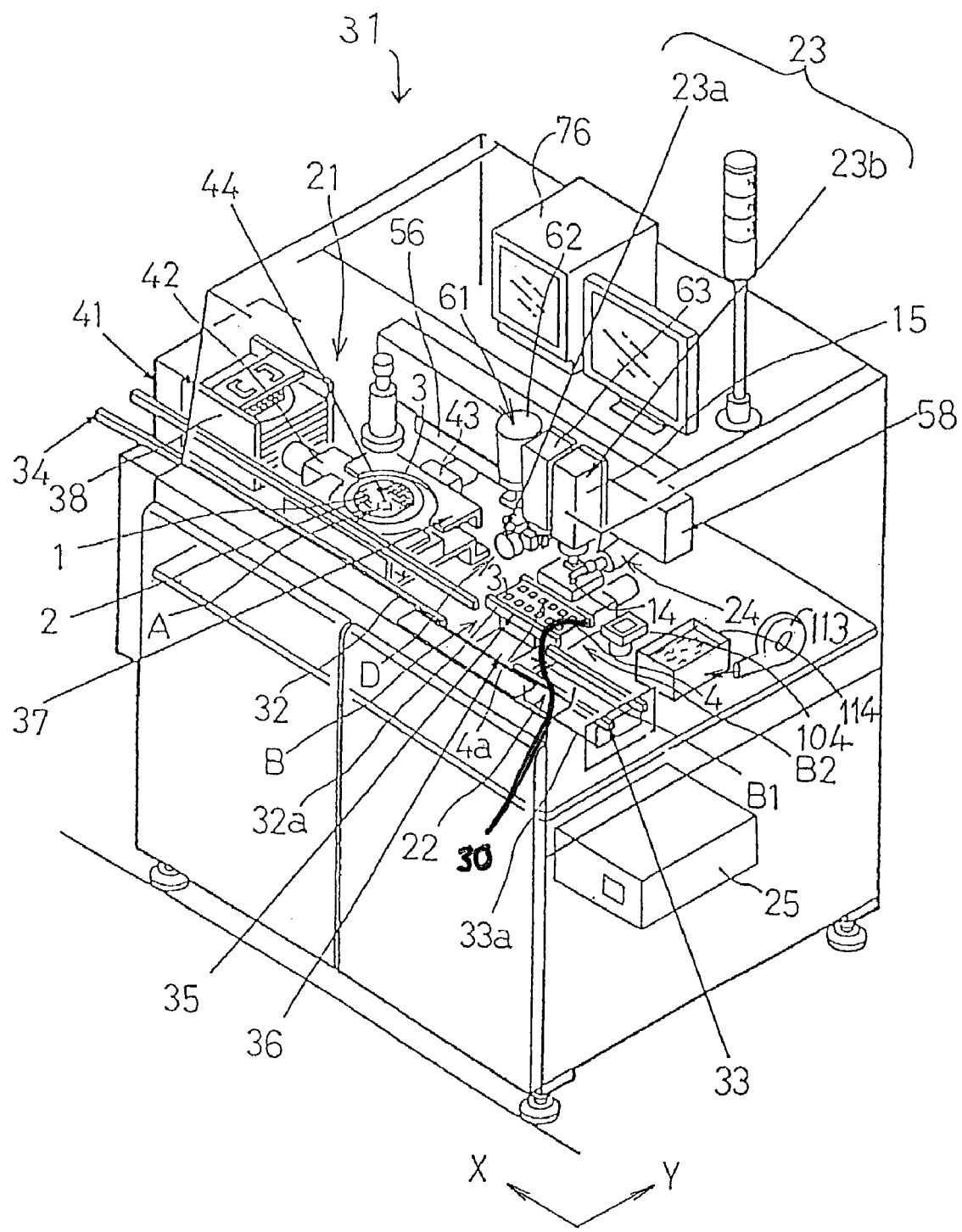
FIG. 6 is a perspective view schematically showing the overall construction of one embodiment of the component mounting apparatus which performs the mounting operation shown in FIG. 3 and surface refining treatment shown in FIGS. 4A–4C.

The component mounting apparatus of this embodiment shown in FIG. 6 comprises a component feeding section 21 where components such as bare IC chips 3 are fed to a predetermined position A, an object handling device 22 by which an object such as circuit board 4 is fed to a component mounting position B and transferred to a next step after chips have been mounted thereon, a component handling device 23 having the component handling tool or the suction nozzle 14 for bringing a component to a position opposite to circuit board 4 so that the bonding face 3a of IC chip 3 and the bonding face 4a of circuit board 4 face each other and their metallic interconnects 5, 6 are pressure-welded, an ultrasonic vibration device 24 for applying vibration to between the support point Q of the rockably supported suction nozzle 14 and its working face 14a, and a controller 25 for controlling the above sections and devices to perform ultrasonic bonding. The suction nozzle 14 need not necessarily be supported rockable but may be supported otherwise such as to be capable of reciprocating, and vibration may be applied thereto by other mechanisms.

In the example shown in FIG. 5, the object handling device 22 is disposed in the front part of a base body 31, where the circuit board 4 is handled such that its bonding face 4a is upwards, so that IC chips can be readily mounted thereon from upper side. The object handling device 22 comprises a loader 33 at one end of rails 32 and an unloader 34 at the other end thereby constituting a transfer mechanism for transporting a circuit board 4 in a direction X. The object handling device 22 may be constructed such as to transport the circuit board by other types of carrier in accordance with the size and shape of object. The rails 32 include an independent portion 32a immediately downstream of loader 33 as shown in FIG. 5 and FIG. 6, which is the area defined as a component mounting position B. The rail 32a, together with a bonding stage 35, which holds a circuit board 4 received thereon by suction from below, are supported on a table 35 and thereby moved in a direction Y orthogonal to the aforementioned direction X between a delivery position B1 where the rail 32a is aligned in single file with the rails 32 and an operating position B2 therebehind where the component mounting is performed.

When a circuit board 4 carried in from loader 33 arrives at the component mounting position B on rail 32a, circuit board 4 is received on bonding stage 35 at a predetermined location defined by a stopper 30, and is positioned by a locator 30b which presses circuit board 4 towards one side of rail 32a. After location of circuit board 4, it is held by suction on bonding stage 35. Meanwhile, bonding stage 35 itself is moved and located at the operating position B2 thereby feeding circuit board 4 for mounting operation. After component installing is completed at operating position B2, bonding stage 35 moves to the delivery position B1 and releases circuit board 4 for allowing it to be fed downstream and transferred to unloader 34 where it is discharged for a next step. Thus a multiplicity of circuit boards 4 are successively fed for mounting operation and electronic circuit boards can be continuously manufactured.

Loader 33 and bonding stage 35 respectively have a preliminary heater 33a and main heater 35a. Circuit board 4 is first heated at preliminary heater 33a and then heated again at main heater 35a so that a sealant 11 filled between circuit board 4 and bare IC chip 3 as shown in FIG. 3 is heated to a temperature of about 25 C.

Figure 3:
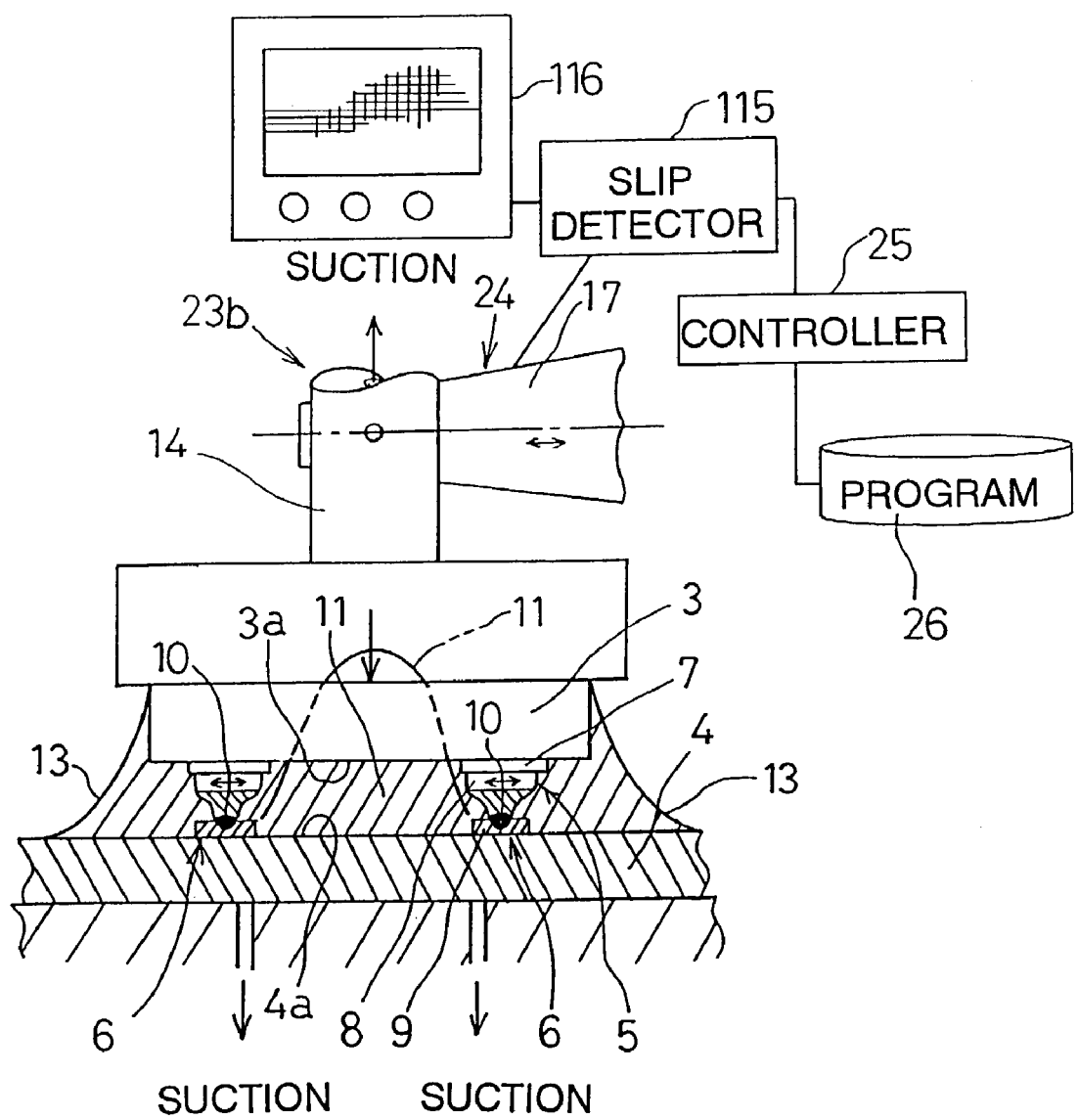
FIG. 3 is a diagram given in explanation of one example of mounting operation of bare IC chip onto circuit board by metal-bonding using the suction nozzle shown in FIGS. 1A, 1B, and 2.

In this embodiment, sealant 11 is preliminarily supplied on circuit board 4 as shown in phantom lines in FIG. 3, and is spread and filled between bonding faces 3a, 4a of IC chip 3 and circuit board 4 as they are brought into contact and pressed with each other. Therefore, heating is performed at a low temperature unlike the case where a low viscosity sealant is used which must be poured in and heated at a high temperature at about 65 C.

The sealant 11 can be cured because of such low temperature heating during chips 3 are mounted on a circuit board 4. Preliminary heating may be omitted but should preferably be performed for smooth heating. Light such as ultraviolet may also be used for setting sealant 11.

Component feeding section 21 is disposed behind rails 32 downstream of component mounting position B and comprises a component magazine 38 in which bare IC chips 3 diced from a semiconductor wafer 1 on a dicing sheet 2 are stocked. Component magazine 38 is moved upward and downward by a magazine lifter 41. Magazine lifter 41 determines the height of component magazine 38 such that a dicing sheet 2 carrying thereon a desired type of chips 3 is positioned opposite to a discharge means (not shown). Dicing sheet 2 pushed or pulled out is held and spread on an expand stage 37 so that each of the IC chips 3 is distanced from each other and readily picked up.

Expand stage 37 is moved in X and Y directions by tables 42, 43 respectively so that the chip 3 on dicing sheet 2 which is to be picked up is located at a component feeding position A above a push-up pin 44 where chips are thrust upwards by push-up pin 44. When the feeding of IC chips 3 is completed or the types of IC chips 3 need to be changed, the dicing sheet 2 on expand stage 37 is accordingly exchanged with another. Thus various kinds of IC chips 3 are successively and automatically fed and mounted as required. It should be noted that the component feeding section 21 may be arranged variously according to the types and feeding modes of components to be mounted, and may be disposed in combination with matching component handling devices 23.

Figure 8:
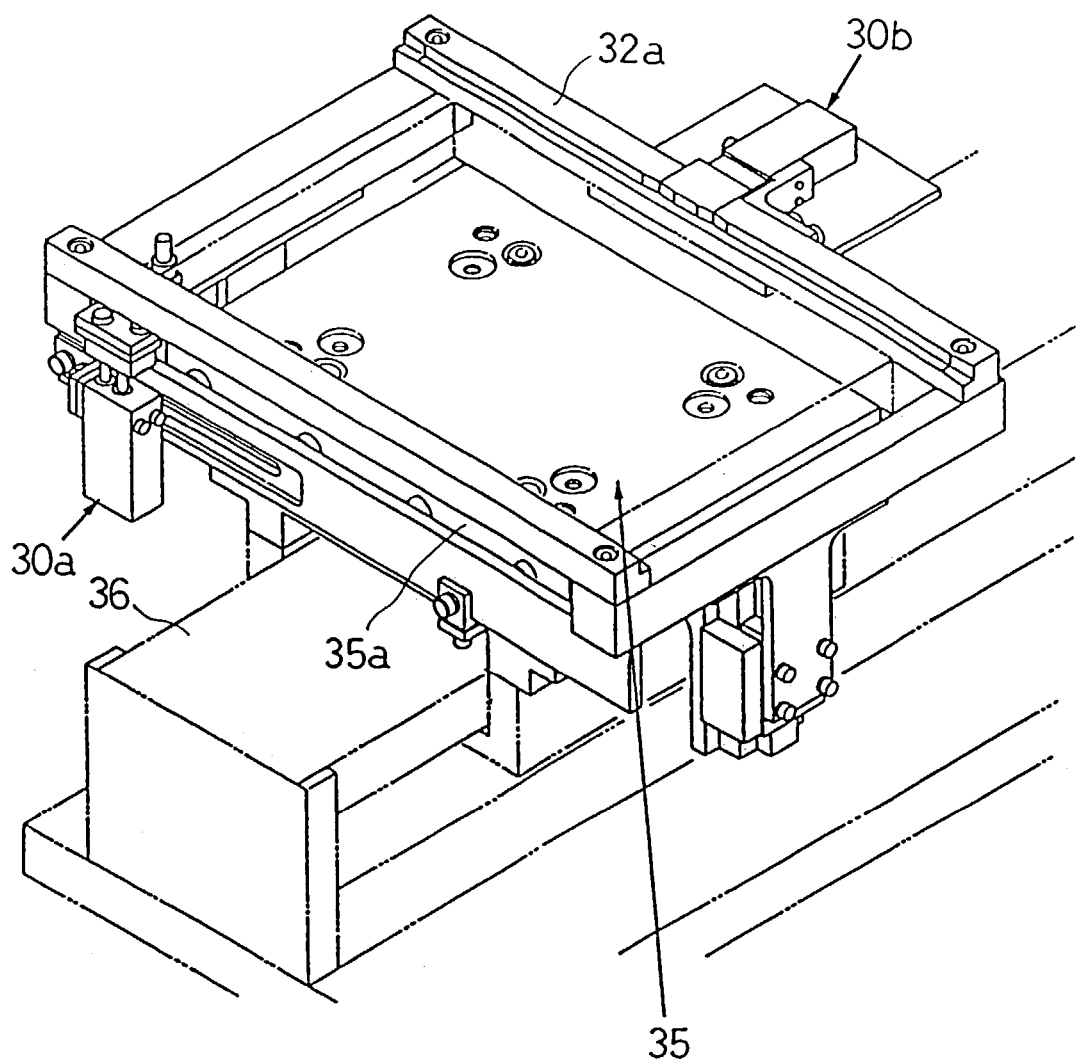
FIG. 8 is a perspective view showing a bonding stage disposed at a component mounting position in the apparatus shown in FIG. 6.
Figure 9:
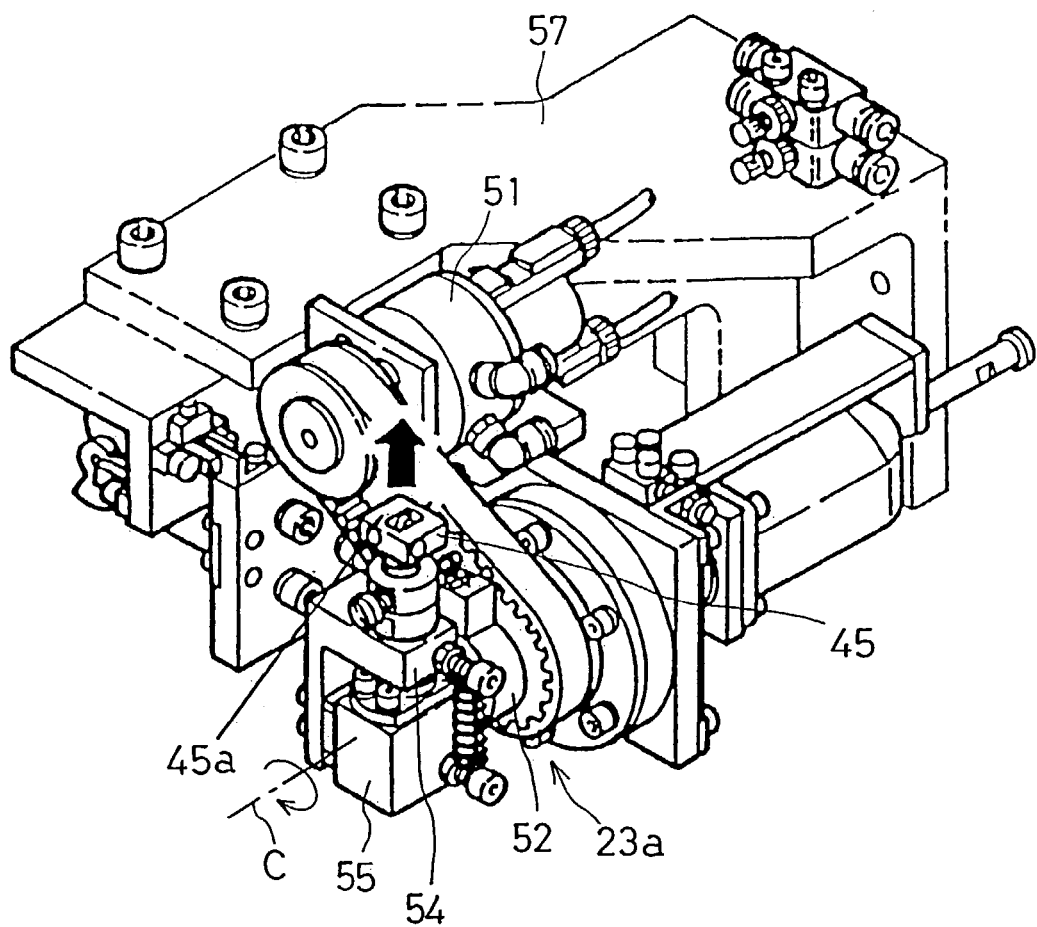
FIG. 9 is a perspective view showing a flipping device of the component handling device in the apparatus shown in FIG. 6.

Since the circuit board 4 is fed with its bonding face 4a upwards while the component feeding section 21 supplies IC chips 3 with their bonding faces upwards in this embodiment, the component handling device 23 comprises a flipping device 23a and a bonding device 23b as shown in FIG. 8 and FIG. 9. Flipping device 23a picks up a component with a component handling tool such as a suction nozzle 45 from above and turns over the component upside down. More specifically, flipping device 23a turns the component handling tool around a point on its suction face 45a or a point C somewhat off from the suction face 45a so as to turn over the component 3. Bonding device 23b equipped with ultrasonic vibration device 24 then picks up the component 3 and feeds it for ultrasonic bonding on circuit board 4 at the component mounting position B. Components such as IC chips may be turned over with various other mechanisms.

The bonding device 23b is equipped with the suction nozzle 14 mentioned before and performs the component mounting. The flipping device 23a is also equipped with a suction nozzle 45 but a different one than the suction nozzle 14 and does not perform chip mounting.

IC chips 3 on a dicing sheet 2 spread on expand stage 37, whether used,alone or in combination with other parts feeders which supply components in a different form, are first picked up and turned over by the flipping device 23a and then picked up by the bonding device 23b. Meanwhile, the object handling device 22 feeds a circuit board 4 at the component mounting position B with its bonding face 4a upwards. Chip is then brought in contact with circuit board 4 with their metal interconnects 5, 6 pressed with each other, and the bump 8 and conductive land 9 are ultrasonic-bonded. The flipping device 23a and bonding device 23b cooperate with each other in mounting chips 3 fed with their faces upwards on a circuit board 4 continuously as described above.

Referring to FIG. 6 and FIG. 9, flipping device 23a is mounted on a base 57 which is moved by a table 56 in a direction X between the component feeding position A where it picks up chips 3 and the delivery position D where it delivers the inverted chip to the bonding device 23b. Also mounted on base 57 are a motor 51, a shaft 52 driven to rotate by motor 51, and a flipping head 54 equipped with one or a plurality of component handling tools or suction nozzles 45 as in this embodiment mounted around shaft 52. Suction nozzle 45 is advanced and retracted on flipping head 54 in an axial direction by means of an air cylinder 55.

Suction nozzle 45 is faced downward and moved up and down at component feeding position A for picking up chips 3, and then is turned around the point C mentioned before to be upwards for turning over the chip 3 before feeding it to the bonding device 23b at delivery position D.

Bonding device 23b is moved between delivery position D and mounting position B by a table 58 in direction X in this embodiment. The construction may be arranged such that the flipping device 23a is set stationary at component feeding position A whereas the bonding device 23b is capable of moving between feeding position A and mounting position B, or conversely, the flipping device 23a may be moved from feeding position A to mounting position B while the bonding device 23b stays at mounting position B.

The combination of movements of bonding device 23b in the direction X and movements of bonding stage 35 in the direction Y enables a chip 3 to be mounted at any location on circuit board 4. The construction should not be limited to this example and may be variously arranged.

Both flipping device 23a and bonding device 23b need not necessarily be moved linearly but in various other forms including non-linear movements.

This embodiment of the apparatus further has a sealant feeder 61 which supplies sealant 11 on at least one of bonding faces 3a, 4a of IC chip 3 and circuit board 4 before they are faced opposite to each other upon being activated by the controller 25. Sealant feeding is thus accomplished automatically in a single apparatus which performs component mounting.

Sealant feeder 61 may be, for example, disposed such as to be moved in the direction X together with bonding device 23b by the table 58 as shown in FIG. 6. By way of example, sealant feeder 61 in this embodiment operates such that when it is moved to component mounting position B, it lowers a dispenser 62 by means of a cylinder 63 for feeding sealant 11 on the bonding face 4a of circuit board 4 as shown in phantom lines in FIG. 3. After the feeding is completed, dispenser 62 is lifted and sealant feeder 61 is retreated sidewards. At the same time the bonding device 23b moves to component mounting position B and presses the chip down upon the sealant on circuit board 4 with the suction nozzle 14.

Figure 7:
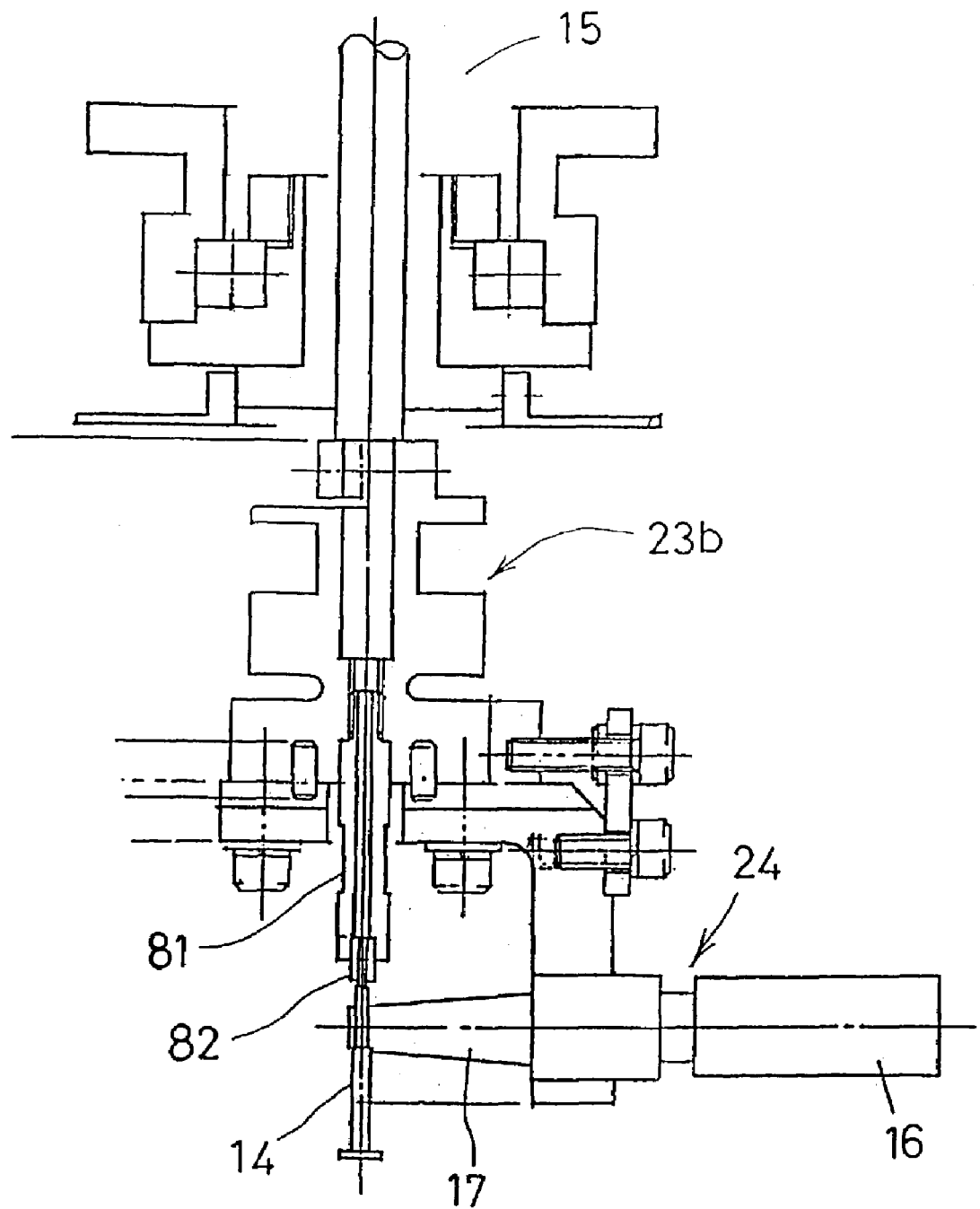
FIG. 7 is a cross section of a bonding device which is a part of a component handling device of the apparatus shown in FIG. 6.

In this embodiment, magnetic pressure of about 500 g~5 kg is applied on chips by means of a voice coil motor 15 which moves suction nozzle 14 up and down. As shown in FIG. 7, a horn 17 is connected to suction nozzle 14, which vibrates upon oscillation of piezoelectric element 16 and transmits ultrasonic vibration of 60 KHz frequency and 1~2 µm amplitude to suction nozzle 14. Friction is thereby generated between bump 8 and conductive land 9 in close contact with each other and both are melted and welded together. In order to protect suction nozzle 14 from damage upon application of ultrasonic vibration, suction nozzle 14 is connected to a support shaft 81 via a resilient tube 82 and is supported rockable around a point Q. Such support structure and position of rocking point of suction nozzle 14 may be variously altered. Suction is applied from support shaft side to suction nozzle 14 through resilient tube 82. Such structure should not be limited either to this example and variously designed.

A bump may be formed on conductive land 9 on circuit board 4 in place of or in addition to bump 8 on electrode 7 of chip 3. Provision of such bump on at least one of interconnects of chip 3 and circuit board 4 enables local ultrasonic bonding to be performed securely with a sufficient amount of metal and without being interfered or damaged by other parts.

Preferably but not limited, microcomputers may be used for the controller 25. Various other construction and modes for controlling operations of the apparatus may be employed. Program data 26 such as shown in FIG. 3 may be stored in a memory inside the controller 25 or in an outer memory, or may take any other form or structure such as a hardware circuitry for performing sequence control.

Figures 1A, 1B:
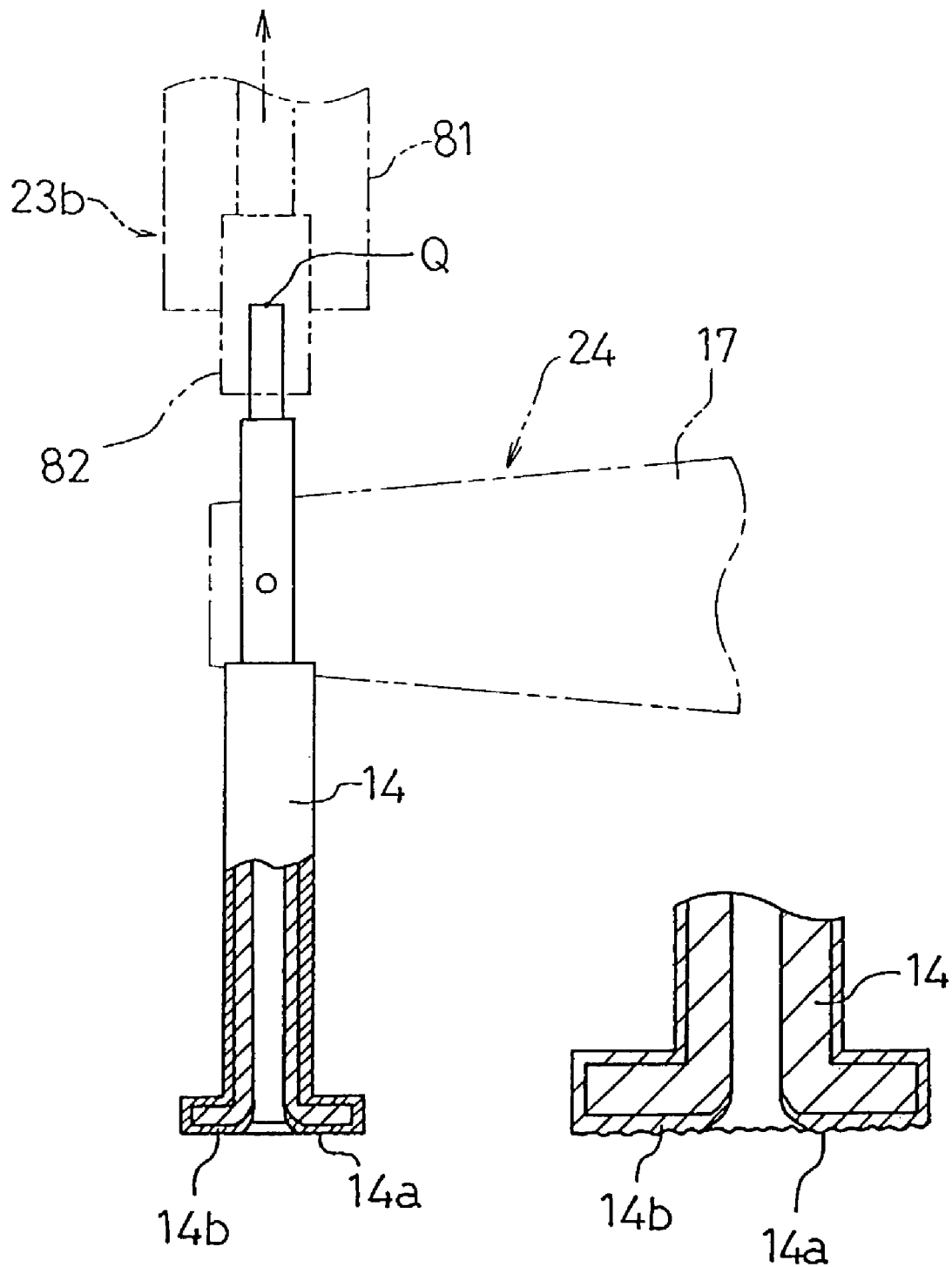
FIG. 1A depicts one example of suction nozzle in the embodiment of the present invention partly in cross section and FIG. 1B is a cross section of the tip portion of the nozzle of FIG. 1A.
Figure 2:
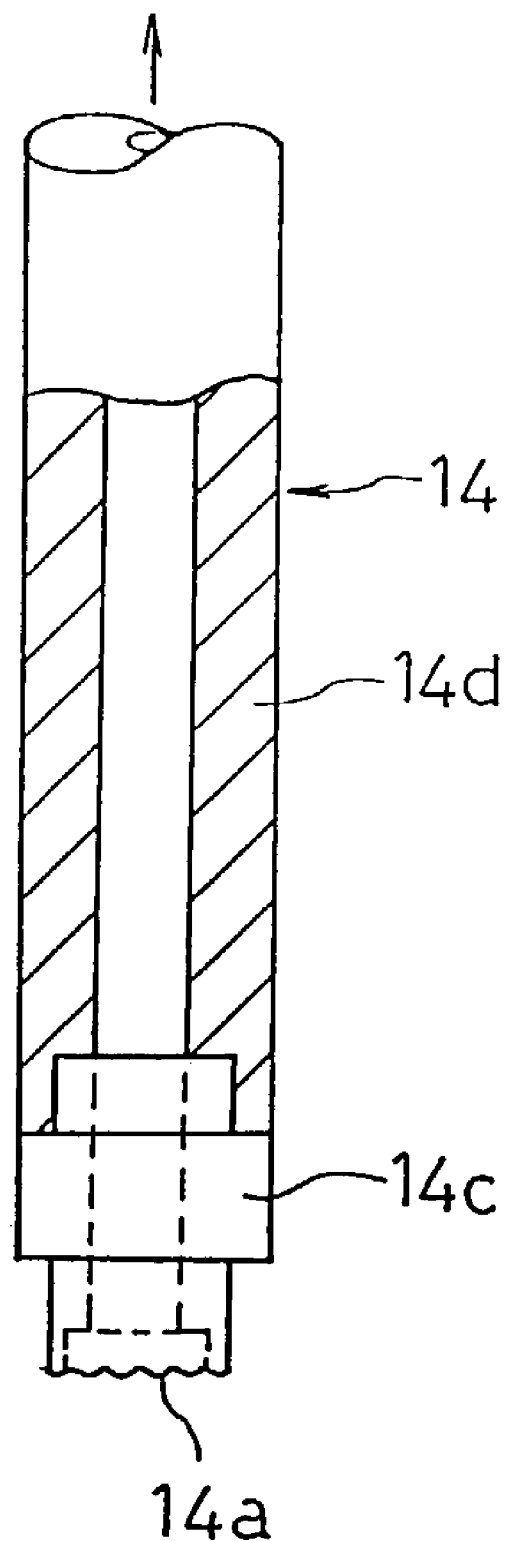
FIG. 2 is a side elevation view showing partly in cross section a part of a modified suction nozzle in the embodiment of the present invention.

The suction nozzle 14 of this embodiment is made of stainless steel and has a hardened layer 14b on its working face 14a as shown in FIGS. 1A, 1B. Alternatively, the suction nozzle 14 may include a suction head 14c as shown in FIG. 2 made of ceramic carbide. In both cases the working face 14a is formed to have surface roughness of about 3~5 µm.

Hardening process is categorized roughly into two types: Coating process involves coating of cemented carbide or hard material on the surface of metal. Surface treatment process involves refining of a surface layer of metal.

Coating process includes plating of hard chromium and various ceramic materials which provides high performance properties, flame or plasma spraying of metal ceramic, and various thin-film forming methods performed in vacuum such as chemical vapor deposition, sputtering, and coating of diamond-like carbon.

In the case of applying ceramic hard coatings, TiN, for example, is coated on the metal surface to a thickness of 3~5 µm and processed at a temperature of 300~500° C., and the resultant coating has Vickers hardness of 2,300 and frictional coefficient of 0.4, and is resistant to heat up to 600° C. TiCN coating applied on the metal surface to a thickness of 3~5 µm and processed at 450~500° C. has Vickers hardness of 3,300 and frictional coefficient of 0.3, and is resistant to heat up to 400° C. In both cases abrasive wear resistance is remarkably improved.

A metal surface cementation method called Kanuc process has been developed by Kanuc Corporation, Japan as an innovative surface treatment technique. Kanuc process is a kind of vacuum nitriding process for hardening the surface of metal, in which nitrogen is diffused on the metal surface in a vacuum furnace with a reactive gas mainly consisting of $NH_3$ and various active materials including stabilizer, nitrogen generator, and adhesion prevention agent. The hardness of metal is remarkably increased by this process and specifically the surface of stainless steel can be hardened to Vickers hardness of 1500. The abrasion proof properties are accordingly improved. The finished surface is stable and has a diffusion layer of 20~80 µm without any brittle layers. Fracture or separation of hardened layer does not occur and there are no pin holes. Deposition of coating is performed at high temperatures of 500~540° C., but dimensions of metal body hardly change, as deformation or expansion of metal body is suppressed to a minimum extent.

Basically, only the working face 14a of suction nozzle 14 needs such surface treatment, but it is preferable to also apply the hard coating to the side periphery continuing from the working face 14a in order to prevent possible separation of coating layer. However, such hard coating should be applied only to the tip area of suction nozzle 14 so as not to affect vibration characteristics.

Both suction nozzles 14 shown in FIG. 1 and FIG. 2 comprise a base body of stainless steel SUS420J2 that has been quenched and tempered. Suction head 14c including working face 14a in FIG. 2 is made of cemented carbide and is bonded to the stainless steel base body 14d with brazing solder e.g. consisting of Ag. For cemented carbide, both of the WC—Co type and WC—Ti(Ta, Nb)C—Co type may be used.

The suction nozzle 14 shown in FIG. 1 or FIG. 2 is used in the above described component mounting method wherein metal interconnects 5, 6 of bare IC chip 3 and circuit board 4 are bonded by friction by applying ultrasonic vibration to a point between the support point of rockable suction nozzle 14 and its working face 14a. The hardened layer 14b or the suction head 14c made of cemented carbide hardly affects the vibration characteristics and vibration transmission characteristics of the suction nozzle 14, since the suction nozzle 14 is mainly made of stainless steel and its working face 14a is formed to have a predetermined roughness. The above ultrasonic bonding can thus be achieved swiftly and precisely. Deterioration of surface regularity and flatness because of abrasion caused by repeated ultrasonic bonding, electrochemical reaction, or foreign matter is suppressed because of the hardened layer or cemented carbide applied to the working face 14a. The suction nozzle 14 can thus exhibit favorable bonding characteristics stably for a longer period of time and the frequent replacement thereof becomes no longer necessary. The operational life of suction nozzle 14 is lengthened. As the downtime of the component mounting apparatus for ultrasonic bonding operation is reduced, productivity is enhanced accordingly.

While the above described ultrasonic bonding using suction nozzle is repeated, an abrasive 101 is brought into contact with the working face 14a as shown in FIG. 4A and FIG. 5 and ultrasonic vibration is applied to the suction nozzle 14 at appropriate time so that the working face 14a is rubbed with abrasive 101 and thereby refined to have predetermined surface roughness. In this way, polishing of the working face 14a can be accomplished efficiently in a short time using friction generated by ultrasonic vibration. Thus the nozzle is refined quickly without replacement thereof during the component mounting operation.

The abrasive 101 in this embodiment is in a continuous tape-like form and fed from a feed roll 102 to a take-up roll 103 so that the working face 14a is refined with fresh abrasive repeatedly without exchange operation of abrasive 101. The abrasive 101 may be fed each time or every few times polishing is completed, or may be moved intermittently or continuously during the polishing.

In one example, suction nozzle 14 was polished with an abrasive 101 of roughness scale #8000~#10000 by applying ultrasonic vibration of 60 KHz frequency and 1~2 μm amplitude with a load of 300~500 g applied to the nozzle in frictional contact with abrasive while moving the abrasive 101 at 10~50 mm/sec by 10~20 mm. The working face 14a was refined to desired roughness in about 30 seconds.

Referring to FIG. 6, the component mounting apparatus of this embodiment is equipped with a polishing device 104 disposed beside the component mounting position B2 for feeding abrasive 101 as required for refining the working face 14a of suction nozzle 14. Controller 25 controls the device such that the working face 14a of suction nozzle 14 is brought into contact with abrasive 101 and the ultrasonic vibration device 24 is activated so that the working face 14a is rubbed with abrasive 101 and refined at appropriate time during the component mounting operation wherein IC chips 3 are mounted on circuit board 4 by ultrasonic bonding.

In this way, the working face 14a of suction nozzle 14 is automatically polished as required and one suction nozzle can be continuously used until termination of its operational life when it has been worn off to a usable limit. The need for dismounting and mounting the suction nozzle each time it must be refined is eliminated, whereby the decrease in productivity by a long downtime of the apparatus is prevented.

The polishing device 104 comprises a horizontal adjustment mechanism 105 including a table 106 made of stainless steel and supported with a stand 109 for keeping the support face 106a of table 106 horizontal, on which the abrasive 101 is supported and guided as shown in FIG. 4A and FIG. 5. Table 106 comprises a tiltable portion 106b in the form of an hour glass at its intermediate location and is divided into upper table 106c having the support face 106a and lower table 106d. The upper table 106c can sway about the tiltable portion 106b with respect to the lower table 106d, and horizontal adjustment of the support face 106a can be made by the directions and amount of the inclination of this upper table 106c.

In the example shown in FIG. 5, adjusting bolts 107 are screwed from underside of the lower table 106d at four locations surrounding the tiltable portion 106b and are in contact with underside of the upper table 106c, so that the distance between the upper and lower tables 106c, 106d can be varied at the four locations around the tiltable portion 106b by screwing each bolt 107. The inclination of upper table 106c with respect to lower table 106d can be thereby adjusted such that the support face 106a is laid horizontal and orthogonal to the axial line of suction nozzle 14 set in the apparatus. The bolts 107 may be screwed from the upper table side and may be provided at three locations. Other specific construction of such horizontal adjusting means may be variously modified.

Thus the working face 14a of suction nozzle 14 can be polished in a direction orthogonal to the axial line of the suction nozzle 14 of the component handling device 23 set in the apparatus, and the automatic refining process of the working face 14a is performed appropriately without skew.

Furthermore, the support face 106a of the polishing device 104 is formed on a glass plate 108 which is held by suction on the upper table 106c of which inclination is adjusted as shown in FIG. 4A. Such glass plate will not resiliently deform like a metal material when the suction nozzle 14 is pressed onto abrasive 101 and ultrasonic vibration is applied thereto, and therefore, once the support face 106a of abrasive 101 is adjusted horizontally, the working face 14a can be polished in a correct attitude. Glass plate 108 should preferably be polished to increase flatness, but any other material may be substituted for such glass plate for achieving similar effects.

Controller 25 activates a feeding mechanism 11 including feeding roll 102 and take-up roll 103 for moving abrasive 101 as required, for example after completing surface refining treatment once or several times, or intermittently or continuously during the polishing process. Abrasive 101 for polishing working face 14a is thus automatically and successively replaced.

In place of the above surface refining treatment, the working face 14a of suction nozzle 14 may be cleaned by immersing nozzle into cleaning liquid 112 and applying ultrasonic vibration to nozzle 14 as shown in FIG. 4B. The working face 14a is refined to have desired roughness in a manner wherein foreign substance adhered to the working face 14a during the bonding operation are removed. More preferably, the cleaning may be made after the polishing of working face 14a with polishing device 104, by which abrasive powder adhered to the working face 14a that may adversely affect vibration transmission characteristics can be removed. Alcohol such as $C_2H_5OH$ is preferable for the cleaning liquid 112 but not limited to it and any other suitable liquid may be used.

After the cleaning, the working face 14a of suction nozzle 14 is quickly dried with a blower 113 and is swiftly made reusable after cleaning.

The component mounting apparatus of this embodiment shown in FIG. 6 is equipped with a cleaner tank 114 for containing the cleaning liquid 112 and the blower 113 adjacent to the polishing device 104, and controller 25 performs controlling of cleaning and blowing processes for a predetermined period of times (several seconds) respectively with cleaner tank 114 and blower 113 after the refining with polishing device 104. Blowing is advantageously performed with cold air which does not present problems of heat effect or heat consumption. The component mounting apparatus of the present invention is thus capable of performing not only mounting operation but also surface refining treatment by polishing, cleaning, and drying.

The component mounting apparatus further has a slip detector 115 as shown in FIG. 3 for detecting the slip between the working face 14a of suction nozzle 14 and component such as IC chip 3. Since controller 25 determines when to perform the surface refining treatment according to the detection results of slip detector 115, the polishing can be effected at more appropriate time as compared to the case where the refining is performed regularly at a fixed period of interval, wherein in some cases it may be too late to polish the working face 14a and the bonding quality is thereby lowered, and in other cases it may be too early to perform polishing, whereby the number of polishing operation is increased and the operational life of the suction nozzle 14 is reduced. Slip detector 115 monitors vibration of horn 17 to which ultrasonic vibration is applied by oscillation of piezoelectric element 16 as the ultrasonic vibration source, and detects changes in the slip. More specifically, slip detector 115 monitors changes in electric current using the fact that the ultrasonic vibration of horn 17 increases and decreases in accordance with the degree of friction generated between the working face 14a and component 3, and determines the slip therebetween. The use of an oscilloscope 116 enables an operator to visually check such changes in the slip between the working face 14a and component 3.

In this embodiment, the ultrasonic vibration for the purpose of bonding is applied to the suction nozzle 14 in a direction crossed at right angles to the direction of polishing the working face 14a, i.e., the direction of parallel marks on the working face 14a formed by polishing. The working face 14a can engage the component 3 in a better condition and vibration transmission characteristics are thereby improved. In this regard, the polishing direction should preferably be orthogonal to the vibrating direction for bonding.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A component mounting apparatus comprising:
    a component feeding section for feeding components to a predetermined location;
    an object handling device for handling and positioning an object to which a component is to be mounted at a predetermined location, for component mounting, and for transferring the object to another place;
    a component handling device for picking up a component with a working face of a suction nozzle, bringing the component to a position where a metal interconnect of the component and a metal interconnect of the object face each other, and pressing the component onto the object while ultrasonic vibration is applied to the suction nozzle thereby ultrasonically bonding the component to the object;
    an ultrasonic vibration device for applying ultrasonic vibration between a support point of the suction nozzle, around which the suction nozzle is rockably supported, and the working face of the suction nozzle, the ultrasonic vibration device is configured to vibrate parallel to the working face of the suction nozzle;
    a polishing device for refinishing the working face of the suction nozzle at appropriate times in between bonding of a component to the object, to have a predetermined surface roughness by frictional contact between the working face and an abrasive;
    a controller for controlling the above devices to activate the polishing device and ultrasonic vibration device at appropriate times to bring the working face of the suction nozzle into contact with the abrasive and applying ultrasonic vibration to the suction nozzle to refinish the working face with the abrasive; and
    a slip detector for detecting slip between the working face of the suction nozzle and the component when ultrasonic bonding is performed, wherein the controller executes the polishing of the working face of the suction nozzle in accordance with detection results of the slip detector.

2. The component mounting apparatus according to claim 1 further comprising a cleaner tank containing cleaning liquid, wherein the controller is executed after the working face of the suction nozzle has been polished, to immerse the working face into the cleaning liquid in the cleaner tank while the ultrasonic vibration device is activated, thereby cleaning the working face of the suction nozzle after the polishing thereof.

3. The component mounting apparatus according to claim 2 further comprising a blower, wherein the controller activates the blower after the cleaning of the working face of the suction nozzle so as to blow and dry the working face.

4. The component mounting apparatus according to claim 1 wherein the working face is stainless steel with a nitride diffusion layer of 20 to 80 μm on its surface.

5. The component mounting apparatus according to claim 1 wherein the working face is made of cemented carbide.

6. A component mounting apparatus comprising:
    a component feeding section for feeding components to a predetermined location;
    an object handling device for handling and positioning an object to which a component is to be mounted at a predetermined location, for component mounting, and for transferring the object to another place;

a component handling device for picking up a component with a working face of a suction nozzle, bringing the component to a position where a metal interconnect of the component and a metal interconnect of the object face each other, and pressing the component onto the object while ultrasonic vibration is applied to the suction nozzle thereby ultrasonically bonding the component to the object;

an ultrasonic vibration device for applying ultrasonic vibration between a support point of the suction nozzle, around which the suction nozzle is rockably supported, and the working face of the suction nozzle;

a polishing device for refinishing the working face of the suction nozzle at appropriate times in between bonding of a component to the object, to have a predetermined surface roughness by frictional contact between the working face and an abrasive;

a controller for controlling the above devices to activate the polishing device and ultrasonic vibration device at appropriate times to bring the working face of the suction nozzle into contact with the abrasive and applying ultrasonic vibration to the suction nozzle to refinish the working face with the abrasive; and a slip detector for detecting slip between the working face of the suction nozzle and the component when ultrasonic bonding is performed, wherein the controller executes the polishing of the working face of the suction nozzle in accordance with detection results of the slip detector.

7. The component mounting apparatus according to claim 6 wherein the polishing device supports the abrasive so that the abrasive can be brought into contact with the working face of the suction nozzle, and further comprises a horizontal adjustment device for adjusting the attitude of a support face for supporting the abrasive to be horizontal.

8. The component mounting apparatus according to claim 7 wherein the support face of the polishing device comprises a glass plate held by suction on a table which is adjusted to be horizontal.

9. The component mounting apparatus according to claim 6 wherein the polishing device comprises a feeding mechanism for feeding the abrasive on the support face, and the controller activates the feeding mechanism as required during the polishing of the working face of the suction nozzle.

10. The component mounting apparatus according to claim 6 wherein the ultrasonic vibration device provides movement along a first axis and the working face is stainless steel with a plurality of grooves whose axes are positioned approximately orthogonal to the applied ultrasonic vibration along the first axis.

11. The component mounting apparatus according to claim 6 wherein the abrasive provides a surface roughness to the working face of approximately 3 µm to 5 µm.

12. The component mounting apparatus according to claim 6 further including a cleaning tank for immersing the suction nozzle in cleaning liquid after abrading the working face, and applying ultrasonic vibration to remove any abrasive powder.

13. The component mounting apparatus according to claim 6 further comprising a cleaner tank containing cleaning liquid, wherein the controller is executed after the working face of the suction nozzle has been polished, to immerse the working face into the cleaning liquid in the cleaner tank while the ultrasonic vibration device is activated, thereby cleaning the working face of the suction nozzle after the polishing thereof.

14. The component mounting apparatus according to claim 13 further comprising a blower, wherein the controller activates the blower after the cleaning of the working face of the suction nozzle so as to blow and dry the working face.

15. A component mounting apparatus comprising:

a component feeding section for feeding components to a predetermined location;

an object handling device for handling and positioning an object to which a component is to be mounted at a predetermined location, for component mounting, and for transferring the object to another place;

a component handling device for picking up a component with a working face of a suction nozzle, bringing the component to a position where a metal interconnect of the component and a metal interconnect of the object face each other, and pressing the component onto the object while ultrasonic vibration is applied to the suction nozzle thereby ultrasonically bonding the component to the object;

an ultrasonic vibration device for applying ultrasonic vibration between a support point of the suction nozzle, around which the suction nozzle is rockably supported, and the working face of the suction nozzle;

a polishing device for refinishing the working face of the suction nozzle at appropriate times in between bonding of a component to the object, to have a predetermined surface roughness by frictional contact between the working face and an abrasive, the functional contact between the working face and the abrasive is provided by an abrasive tape of a roughness scale #8000 to #1000 with ultrasonic vibration of 60 KHz and 1 to 2 µm amplitude under a pressure load of 300 to 500 grams applied to the working face while moving the abrasive tape; and a controller for controlling the above devices to activate the polishing device and ultrasonic vibration device at appropriate times to bring the working face of the suction nozzle into contact with the abrasive and applying ultrasonic vibration to the suction nozzle to refinish the working face with the abrasive.

16. The component mounting apparatus according to claim 15 wherein the polishing device supports the abrasive so that the abrasive can be brought into contact with the working face of the suction nozzle, and further comprises a horizontal adjustment device for adjusting the attitude of a support face for supporting the abrasive to be horizontal.

17. The component mounting apparatus according to claim 16 wherein the support face of the polishing device comprises a glass plate held by suction on a table which is adjusted to be horizontal.

18. The component mounting apparatus according to claim 15 wherein the polishing device comprises a feeding mechanism for feeding the abrasive on the support face, and the controller activates the feeding mechanism as required during the polishing of the working face of the suction nozzle.

19. The component mounting apparatus according to claim 15 wherein the ultrasonic vibration device provides movement along a first axis and the working face is stainless steel with a plurality of grooves whose axes are positioned approximately orthogonal to the applied ultrasonic vibration along the first axis.

20. The component mounting apparatus according to claim 15 wherein the abrasive provides a surface roughness to the working face of approximately 3 µm to 5 µm.

21. The component mounting apparatus according to claim 15 further including a cleaning tank for immersing the suction nozzle in cleaning liquid after abrading the working face, and applying ultrasonic vibration to remove any abrasive powder.

22. A component mounting apparatus comprising:

a component feeding section for feeding components to a predetermined location;

an object handling device for handling and positioning an object to which a component is to be mounted at a predetermined location, for component mounting, and for transferring the object to another place;

a component handling device for picking up a component with a working face of a suction nozzle, bringing the component to a position where a metal interconnect of the component and a metal interconnect of the object face each other, and pressing the component onto the object while ultrasonic vibration is applied to the suction nozzle thereby ultrasonically bonding the component to the object;

an ultrasonic vibration device for applying ultrasonic vibration between a support point of the suction nozzle, around which the suction nozzle is rockably supported, and the working face of the suction nozzle, the ultrasonic vibration device is configured to vibrate parallel to the working face of the suction nozzle;

a polishing device for refinishing the working face of the suction nozzle at appropriate times in between bonding of a component to the object, to have a predetermined surface roughness by frictional contact between the working face and an abrasive; and a controller for controlling the above devices to activate the polishing device and ultrasonic vibration device at appropriate times to bring the working face of the suction nozzle into contact with the abrasive and applying ultrasonic vibration to the suction nozzle to refinish the working face with the abrasive, wherein the functional contact between the working face and the abrasive is provided by an abrasive tape of a roughness scale #8000 to #1000 with ultrasonic vibration of 60 KHz and 1 to 2 µm amplitude under a pressure load of 300 to 500 grams applied to the working face while moving the abrasive tape.

\* \* \* \* \*